(12) United States Patent
Gu et al.

(10) Patent No.: US 10,037,899 B2
(45) Date of Patent: Jul. 31, 2018

(54) SEMICONDUCTOR DEVICE WITH HIGH THERMAL CONDUCTIVITY SUBSTRATE AND PROCESS FOR MAKING THE SAME

(71) Applicant: Qorvo US, Inc., Greensboro, NC (US)

(72) Inventors: Xing Gu, Allen, TX (US); Jinqiao Xie, Allen, TX (US); Edward A. Beam, III, Plano, TX (US); Cathy Lee, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/251,590

(22) Filed: Aug. 30, 2016

(65) Prior Publication Data
US 2017/0133239 A1 May 11, 2017

Related U.S. Application Data

(60) Provisional application No. 62/253,766, filed on Nov. 11, 2015.

(51) Int. Cl.
*H01L 23/373* (2006.01)
*H01L 21/48* (2006.01)
(Continued)

(52) U.S. Cl.
CPC ...... *H01L 21/4882* (2013.01); *H01L 23/3732* (2013.01); *H01L 29/2003* (2013.01); *H01L 29/66462* (2013.01); *H01L 29/7787* (2013.01)

(58) Field of Classification Search
CPC ............. H01L 33/0091; H01L 33/0066; H01L 29/2003; H01L 29/66462; H01L 29/42316;
(Continued)

(56) References Cited

U.S. PATENT DOCUMENTS 7,595,507 B2  9/2009  Francis et al.
8,674,405 B1  3/2014  Babic et al.
(Continued)

OTHER PUBLICATIONS

Dumka, D.C. et al., "Electrical and Thermal Performance of AlGaN/GaN HEMTs on Diamond Substrate for RF Applications," 2013 IEEE Compound Semiconductor Integrated Circuit Symposium (CSICS), Oct. 13-16, 2013, IEEE, 4 pages.
(Continued)

*Primary Examiner* — Latanya N Crawford
(74) *Attorney, Agent, or Firm* — Withrow & Terranova, P.L.L.C.

(57) ABSTRACT

The present disclosure relates to a process of forming a high thermal conductivity substrate for an Aluminum/Gallium/Indium (III)-Nitride semiconductor device. According to an exemplary process, a semiconductor precursor including a substrate structure and a buffer structure is provided. The buffer structure is formed over the substrate structure and has a first buffer surface and a second buffer surface. Herein, the second buffer surface is adjacent to the substrate structure and the first buffer surface is opposite the second buffer surface. Next, a high thermal conductivity substrate with a thermal conductivity greater than 400 W/mK is formed over the first buffer surface. A heat sink carrier is then provided over the high thermal conductivity substrate. The substrate structure is then substantially removed to provide a thermally enhanced precursor for the III-Nitride semiconductor device.

18 Claims, 19 Drawing Sheets

(51) Int. Cl.
*H01L 21/338* (2006.01)
*H01L 29/66* (2006.01)
*H01L 29/20* (2006.01)
*H01L 29/778* (2006.01)

(58) Field of Classification Search
CPC .......... H01L 29/7783; H01L 29/66431; H01L 29/802; H01L 29/7788; H01L 29/432
See application file for complete search history.

(56) References Cited

U.S. PATENT DOCUMENTS

| | | |
|---|---|---|
| 9,337,278 B1 * | 5/2016 | Gu ..................... H01L 29/2003 |
| 9,359,693 B2 | 6/2016 | Francis et al. |
| 2015/0279945 A1 | 10/2015 | Francis et al. |
| 2015/0329989 A1 * | 11/2015 | Konovalov ............. C30B 29/04 428/172 |
| 2016/0049351 A1 | 2/2016 | McCann |

OTHER PUBLICATIONS

Non-Final Office Action for U.S. Appl. No. 15/251,813, dated Jan. 11, 2018, 12 pages.

* cited by examiner

SEMICONDUCTOR DEVICE WITH HIGH THERMAL CONDUCTIVITY SUBSTRATE AND PROCESS FOR MAKING THE SAME

RELATED APPLICATIONS

This application claims the benefit of provisional patent application Ser. No. 62/253,766, filed Nov. 11, 2015, the disclosure of which is hereby incorporated herein by reference in its entirety. This application is related to U.S. patent application Ser. No. 15/251,813, filed on Aug. 30, 2016, entitled "SEMICONDUCTOR DEVICE WITH HIGH THERMAL CONDUCTIVITY SUBSTRATE AND PROCESS FOR MAKING THE SAME," the disclosure of which is hereby incorporated herein by reference in its entirety.

FIELD OF THE DISCLOSURE

The present disclosure relates to a semiconductor device and a process for making the same, and more particularly to a semiconductor device with a high thermal conductivity substrate, and a process to form the high thermal conductivity substrate for the semiconductor device.

BACKGROUND

Group III-Nitride semiconductor devices, which include Nitrogen (N) and one or more of Aluminum (Al), Gallium (Ga), and Indium (In), or other group III materials, have attracted extensive attention in semiconductor fabrication technologies in recent years. Because of the higher electron mobility of the group III-Nitride materials compared to silicon, a group III-Nitride semiconductor device may have faster operation speed and allow wider band gap than a silicon semiconductor device. However, the fast operation speed of the group III-Nitride semiconductor device leads to a great amount of heat generation, which is a critical factor that impacts the power performance, the efficiency performance, and the reliability performance of the group III-Nitride semiconductor device. Accordingly, it is desirable to fabricate the group III-Nitride semiconductor device in a configuration for better heat dissipation.

For a high-speed group III-Nitride semiconductor device, Silicon-Carbon (SiC) is widely used to form a substrate, through which the heat generated by the group III-Nitride semiconductor device dissipates. In some high-power applications, SiC may not have high enough thermal conductivity to meet the heat dissipation requirement. A conventional way to solve this issue is to etch the SiC substrate away from the group III-Nitride semiconductor device, and form a high thermal conductivity substrate where the SiC substrate is removed. Normally, an ex situ transition layer with a minimum thickness (greater than 30 nm) is needed between the etched group III-Nitride semiconductor device and the high thermal conductivity substrate to achieve reliable bonding. As such, the ex situ transition layer will create a thermal barrier between the etched group III-Nitride semiconductor device and the high thermal conductivity substrate. Further, a temporary handling wafer is also needed to hold the etched group III-Nitride semiconductor device while forming the high thermal conductivity substrate back to the etched group III-Nitride semiconductor device. In some applications, forming the high thermal conductivity substrate, like diamond deposition, requires a higher temperature than the temporary handling wafer may stand. Consequently, the group III-Nitride semiconductor device with high thermal conductivity substrate, like diamond, may suffer from poor manufacturability.

Accordingly, there remains a need for improved semiconductor device designs that utilize the advantages of group III-Nitride materials and accommodate the increased heat generation of high performance group III-Nitride semiconductor devices. In addition, there is also a need to enhance the thermal performance of the semiconductor devices without increasing the device size.

SUMMARY

The present disclosure relates to a semiconductor device with a high thermal conductivity substrate and a process for make the same. The disclosed semiconductor device includes a heat sink carrier, a high thermal conductivity substrate over the heat sink carrier, and a buffer structure over the high thermal conductivity substrate. The high thermal conductivity substrate has a thermal conductivity greater than 400 W/mK. The buffer structure has a first buffer surface that is adjacent to the high thermal conductivity substrate and a second buffer surface opposite the first buffer surface. Herein, a growth direction of the buffer structure is from the second buffer surface toward the heat sink carrier.

According to an exemplary process, a semiconductor precursor including a substrate structure and a buffer structure over the substrate structure is provided. The buffer structure has a first buffer surface and a second buffer surface, which has a first polarity. Herein the first buffer surface is opposite the second buffer surface and the second buffer surface is adjacent to the substrate structure. Next, a high thermal conductivity substrate is formed over the first buffer surface. The high thermal conductivity substrate has a thermal conductivity greater than 400 W/mK. A heat sink carrier is then provided over the high thermal conductivity substrate. The substrate structure is then removed substantially to provide a thermally enhanced precursor with an exposed surface for the disclosed semiconductor device. The exposed surface of the thermally enhanced precursor has the first polarity.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 1A-1F illustrate an exemplary process to form a thermally enhanced precursor for a semiconductor device according to one embodiment of the present disclosure.

FIG. 2 provides an alternative thermally enhanced precursor with a different polarity order according to one embodiment of the present disclosure.

Figure 1A:
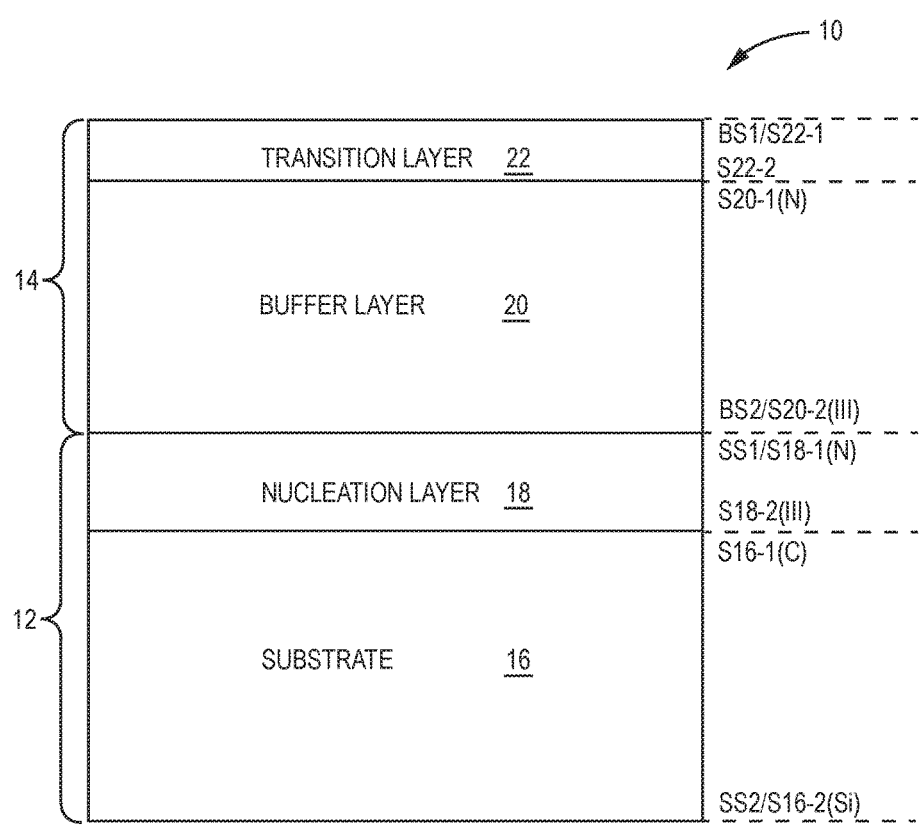

It will be understood that for clear illustrations, FIGS. 1-5G may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element, such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a semiconductor device that has a high thermal conductivity substrate and a process for making the same. Although various types of materials may be used for the semiconductor device, the following examples incorporate group III-Nitrides as the desired materials. Herein group III-Nitrides are those that include Nitrogen (N) and one or more of Aluminum (Al), Gallium (Ga), and Indium (In), or other group III material. A layer within a group III-Nitride semiconductor device has a surface with an N-polarity and an opposite surface with a group III polarity.

FIGS. 1A-1F illustrate an exemplary process to form a thermally enhanced precursor for a semiconductor device according to one embodiment of the present disclosure. Although the exemplary process is illustrated as a series of sequential steps, the exemplary process is not necessarily order dependent. Some operations may be done in a different order than that presented. Further, processes within the scope of this disclosure may include fewer or more steps than those illustrated in FIGS. 1A-1F.

Initially, a semiconductor precursor 10, including a substrate structure 12 and a buffer structure 14 over the substrate structure 12, is provided as depicted in FIG. 1A. The substrate structure 12 includes a substrate 16 and a nucleation layer 18 over the substrate 16, and has a first substrate surface SS1 and a second substrate surface SS2. In this embodiment, the substrate 16 may be formed of Silicon-Carbon (SiC), having a first surface S16-1 with Carbon (C)-polarity and a second surface S16-2 with Silicon (Si)-polarity. Normally, the nucleation layer 18 is used to prevent the substrate 16 from incorporating with the buffer structure 14 and improve an interface between the substrate structure 12 and the buffer structure 14. Herein, the nucleation layer 18 may be formed of Aluminum-Nitride (AlN) or the like, having a first surface S18-1 with an N-polarity and a second surface S18-2 with a group III-polarity, and for this example, an Al-polarity. The first surface S16-1 of the substrate 16 is adjacent to the second surface S18-2 of the nucleation layer 18. The second surface S16-2 of the substrate 16 is opposite the first surface S16-1 of the substrate 16, and the first surface S18-1 of the nucleation layer 18 is opposite the second surface S18-2 of the nucleation layer 18. Further, the first surface S18-1 of the nucleation layer 18 may be the first substrate surface SS1, and the second surface S16-2 of the substrate 16 may be the second substrate surface SS2, which is opposite the first substrate surface SS1.

In addition, the buffer structure 14 includes a buffer layer 20 and a transition layer 22 over the buffer layer 20, and has a first buffer surface BS1 and a second buffer surface BS2. In this embodiment, the buffer layer 20 may be formed of Gallium Nitride (GaN) or the like, having a first surface S20-1 with an N-polarity and a second surface S20-2 with a group III-polarity, and for this example, a Ga-polarity. Herein, the transition layer 22 is an in situ transition layer, which is used to achieve a reliable bonding between the buffer structure 14 and a high thermal conductivity substrate in a following process. The transition layer 22 may be formed from amorphous or polycrystalline materials, such as AlN, Silicon Nitride ($SiN_x$), or the like, with a thickness between 0 nm and 100 nm. The transition layer 22 is not necessarily polarized and/or may have mixed polarization. The transition layer 22 has a first surface S22-1 and a second surface S22-2, which is opposite the first surface S22-1 of the transition layer 22 and adjacent to the first surface S20-1 of the buffer layer 20. The second surface S20-2 of the buffer layer 20 is opposite the first surface S20-1 of the buffer layer 20. Further, the first surface S22-1 of the transition layer 22 may be the first buffer surface BS1 and the second surface S20-2 of the buffer layer 20 may be the second buffer surface BS2, which is opposite the first buffer surface BS1. In some applications, the buffer structure 14 may not include the transition layer 22. As such, the first surface S20-1 of the buffer layer 20 may be the first buffer surface BS1 and the second surface S20-2 of the buffer layer 20 may be the second buffer surface BS2. Herein the second buffer surface BS2 is adjacent to the first substrate surface SS1.

Figure 1B:
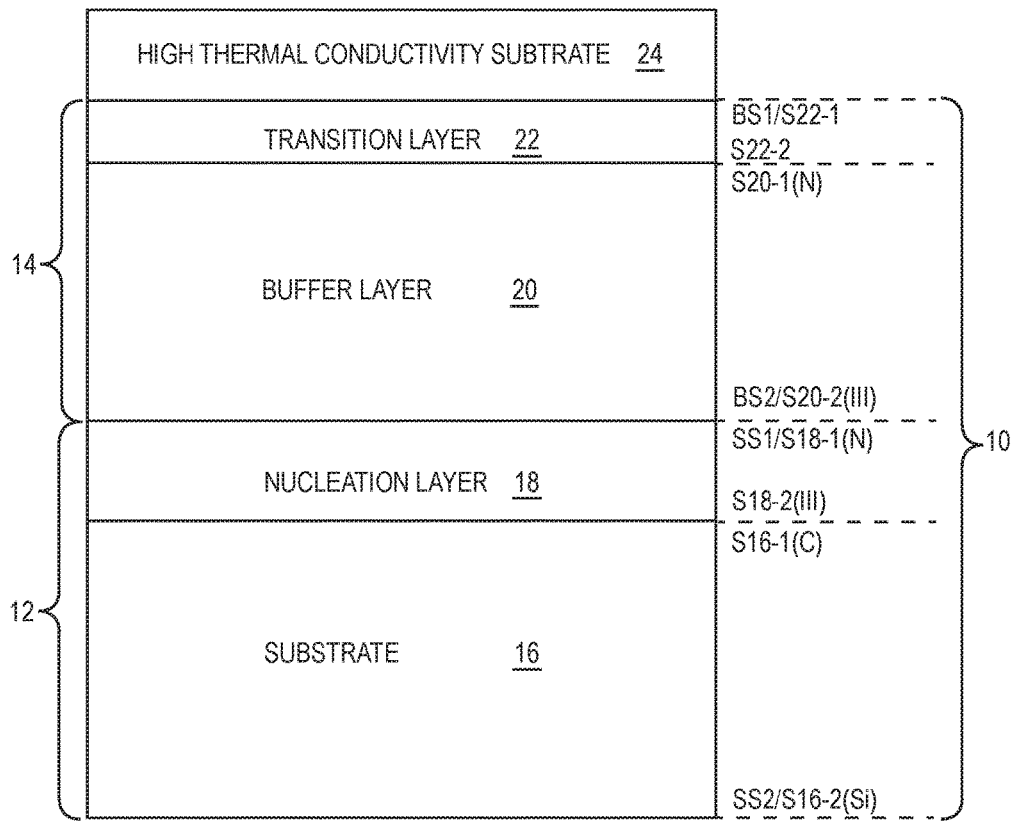
Figure 1C:
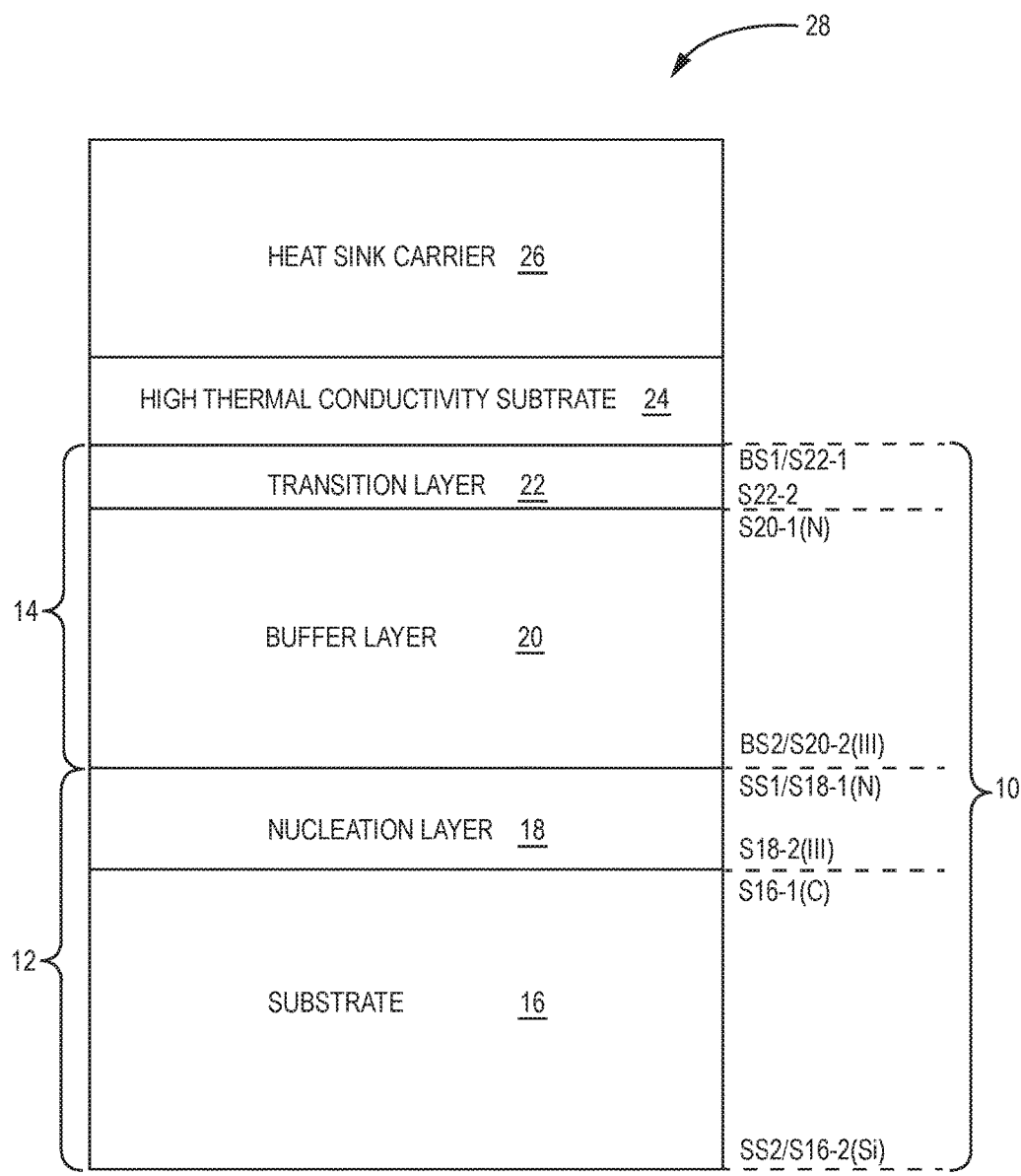

Next, a high thermal conductivity substrate 24 is formed over the buffer structure 14 and adjacent to the first buffer surface BS1 as depicted in FIG. 1B. The high thermal conductivity substrate 24 has a thermal conductivity greater than 400 W/mK, and a thickness between 0.5 μm and 500 μm. One exemplary material used to form the high thermal conductivity substrate 24 is diamond. Others may include Boron Nitride, Boron Arsenide, or the like. Forming the high thermal conductivity substrate 24 may be provided by a chemical vapor deposition process. A heat sink carrier 26 is then provided over the high thermal conductivity substrate 24 to form an intermediate structure 28 as depicted in FIG. 1C. The heat sink carrier 26 may be formed from polycrystalline diamond, Boron Nitride, or Boron Arsenide. The heat sink carrier 26 may have a thermal conductivity greater than 400 W/mK, and a thickness between 0.5 μm and 500 μm. The heat sink carrier 26 may be provided by a wafer bonding process or a thick film growth process.

Figure 1D:
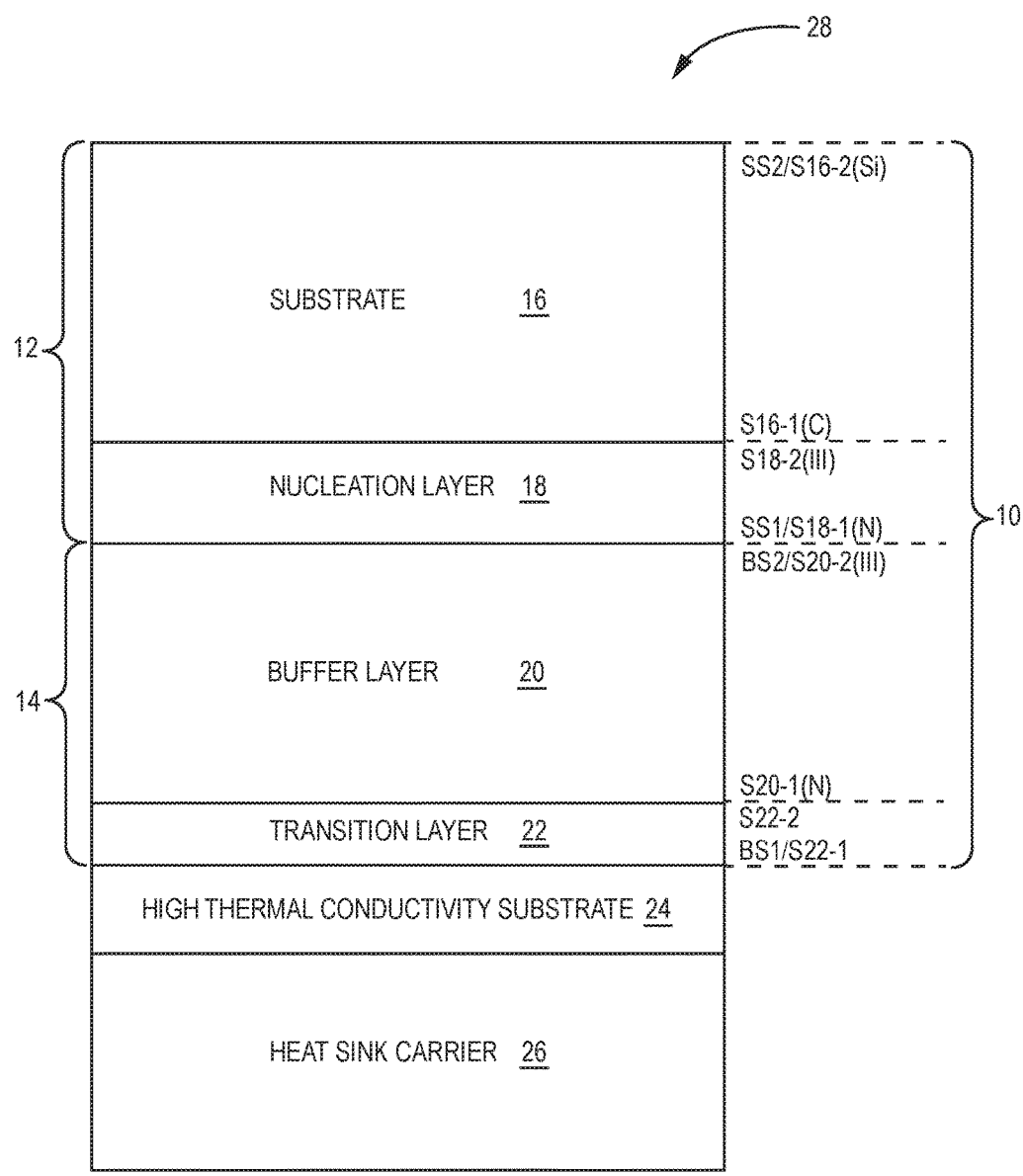

After the intermediate structure 28 is formed, the intermediate structure 28 is flipped as depicted in FIG. 1D. As such, the heat sink carrier 26 is at a bottom portion of the intermediate structure 28, the high thermal conductivity substrate 24 is over the heat sink carrier 26, the buffer structure 14 is over the high thermal conductivity substrate 24, and the substrate structure 12 is over the buffer structure 14 and at a top portion of the intermediate structure 28.

Figure 1E:
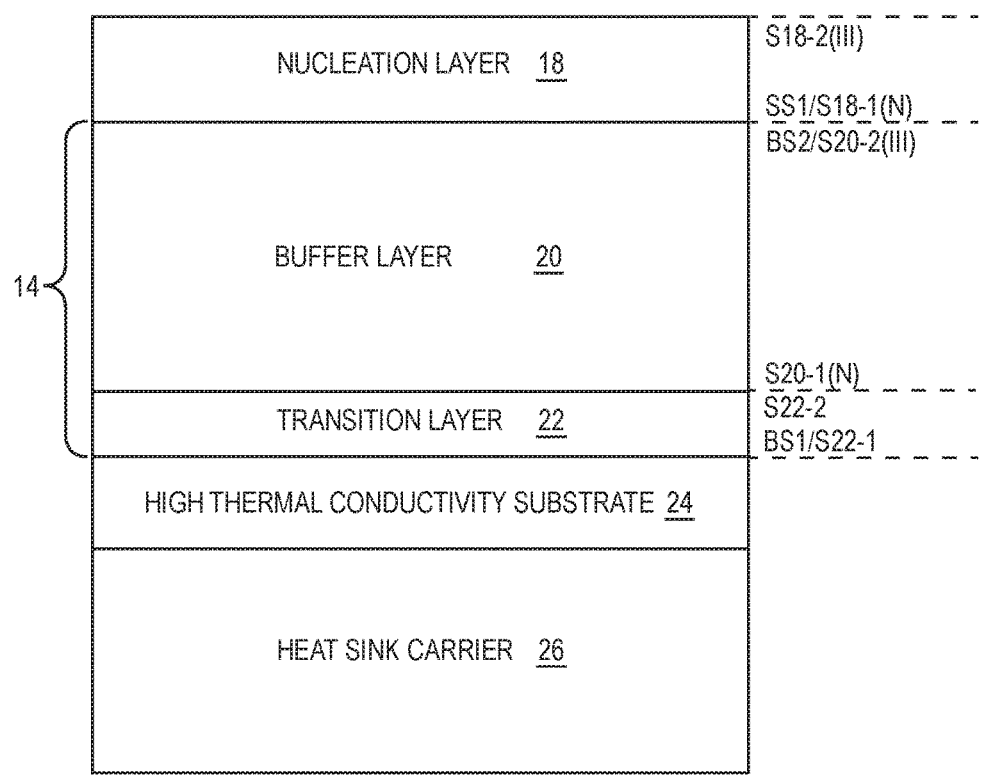
Figure 1F:
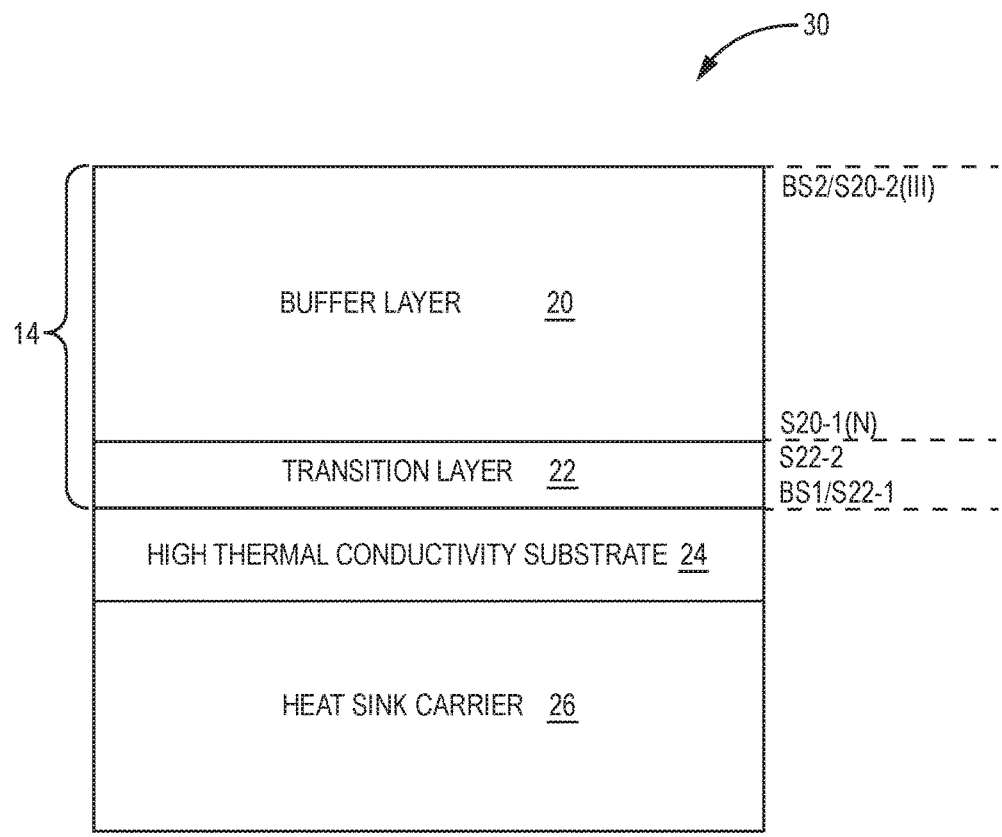

FIG. 1E and FIG. 1F illustrate removing substantially all of the substrate structure 12. The substrate 16 is first removed as depicted in FIG. 1E. The removal of the substrate 16 may be provided by mechanical polishing or dry/wet etching. The nucleation layer 18 is then removed to provide a thermally enhanced precursor 30 with an exposed surface as depicted in FIG. 1F. The removal of the nucleation layer 18 may be provided by mechanical polishing or dry/wet etching. Herein, removing substantially all of the substrate structure 12 is defined as removing all of the substrate 16, and if the nucleation layer 18 is present, removing at least 90% of the nucleation layer 18. The removal may also include removing a portion of the buffer layer 20. As such, in some cases, there is a thin layer of the nucleation layer 18 (not shown) left over the buffer structure 14, and in other cases, the nucleation layer 18 is removed completely and the buffer structure 14 is exposed. The exposed surface of the thermally enhanced precursor 30 has the same polarity as the second buffer surface BS2. In this embodiment, the second buffer surface BS2 is a group III-polarity. Consequently, the exposed surface of the thermally enhanced precursor 30 is a group III-polarity.

The thermal enhanced precursor 30 has the heat sink carrier 26 at a bottom portion of the thermal enhanced precursor 30, the high thermal conductivity substrate 24 over the heat sink carrier 26, and the buffer structure 14 over the high thermal conductivity substrate 24. The high thermal conductivity substrate 24 has a thermal conductivity greater than 400 W/mK. A growth direction of the buffer structure 14 is from the second buffer surface BS2 with the group III-polarity toward the heat sink carrier 26.

Figure 2:
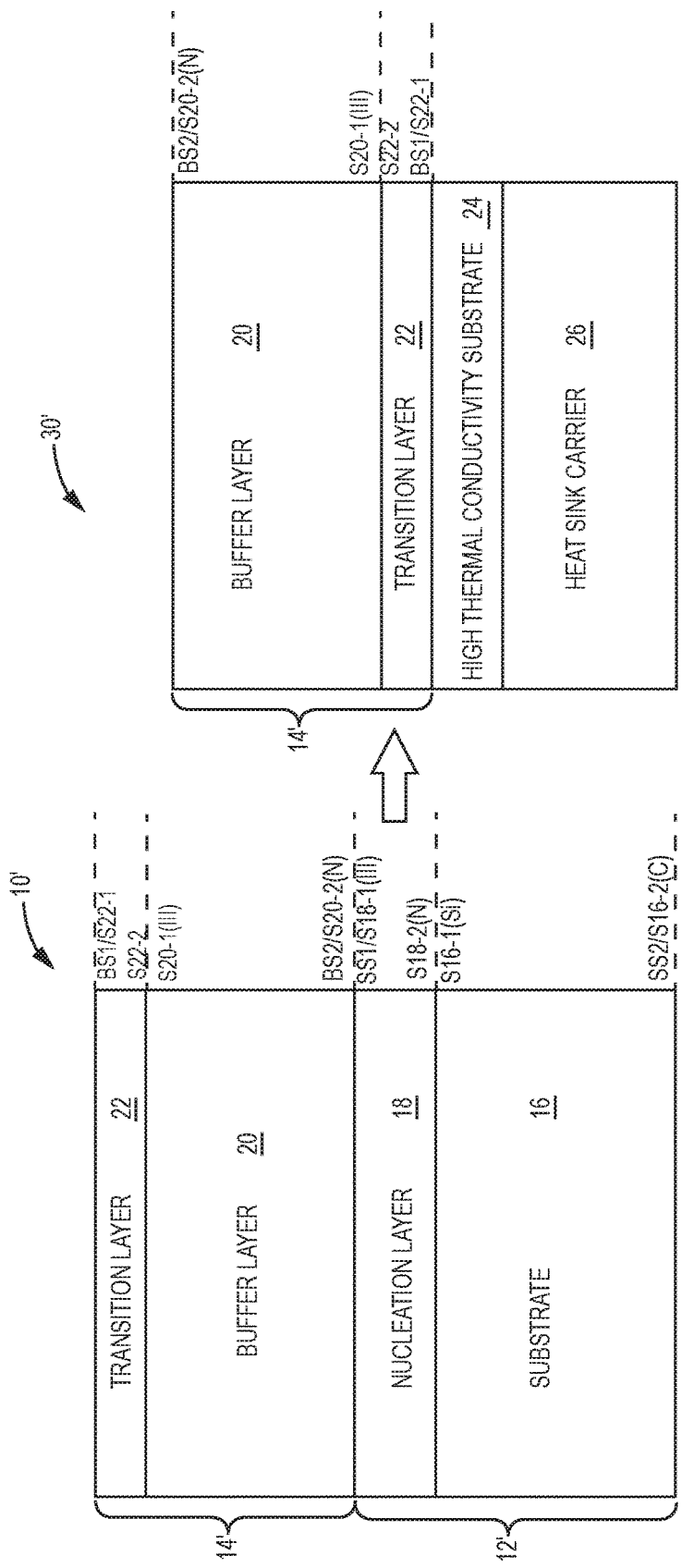

It will be clear to those skilled in the art that the thermal enhanced precursor 30 may have a different polarity order and the exposed surface of the thermal enhanced precursor 30 may have a different polarity. As shown in FIG. 2, a semiconductor precursor 10' has a substrate structure 12' and a buffer structure 14' over the substrate structure 12'. The substrate structure 12' has a first substrate surface SS1 with a group III-polarity and a second substrate surface SS2 with a C-polarity. The buffer structure 14' has a first buffer surface BS1 with a group III-polarity or a Si-polarity and a second buffer surface BS2 with an N-polarity. Herein, the first substrate surface SS1 is opposite the second substrate surface SS2 and adjacent to the second buffer surface BS2, and the first buffer surface BS1 is opposite the second buffer surface BS2. Consequently, a thermal enhanced precursor 30' formed from the semiconductor precursor 10' has an exposed surface with the N-polarity (the same polarity as the second buffer surface BS2).

The thermal enhanced precursor 30' has the heat sink carrier 26 at a bottom portion of the thermal enhanced precursor 30', the high thermal conductivity substrate 24 over the heat sink carrier 26, and the buffer structure 14' over the thermal conductivity substrate 24. The high thermal conductivity substrate 24 has a thermal conductivity greater than 400 W/mK. A growth direction of the buffer structure 14' is from the second buffer surface BS2 with the N-polarity toward the heat sink carrier 26.

Figure 3A:
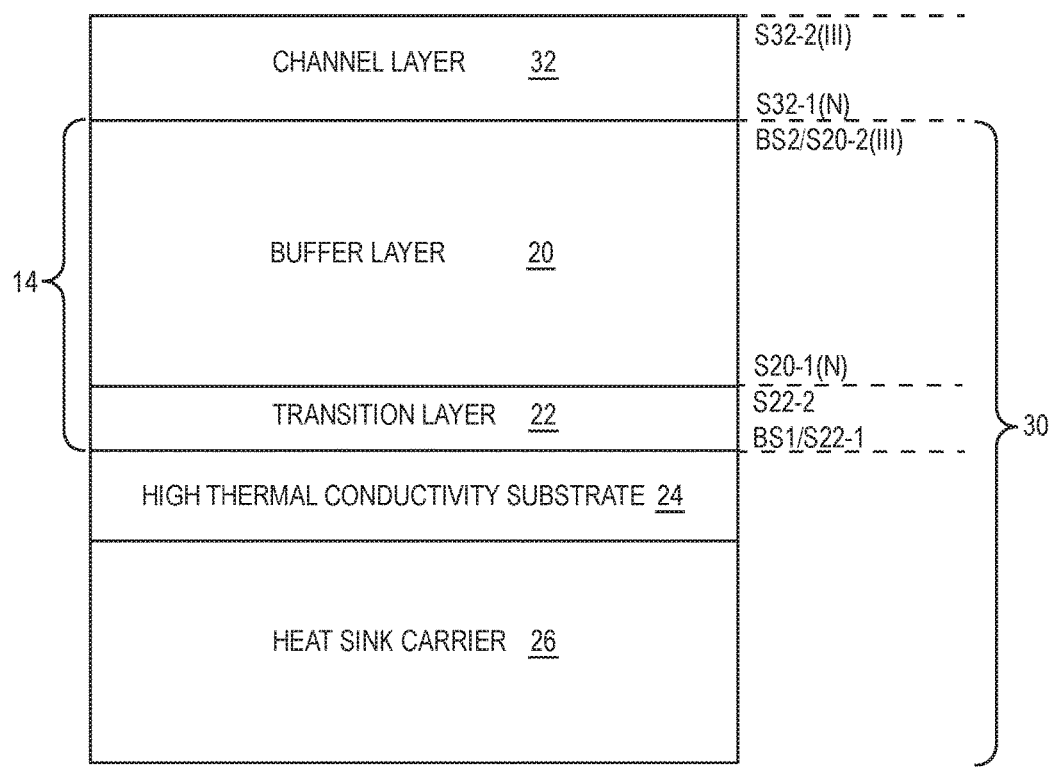
FIGS. 3A-3B illustrate an exemplary process to form a channel structure over the thermally enhanced precursor formed in FIG. 1F to provide a semiconductor device with enhanced thermal performance.
Figure 3B:
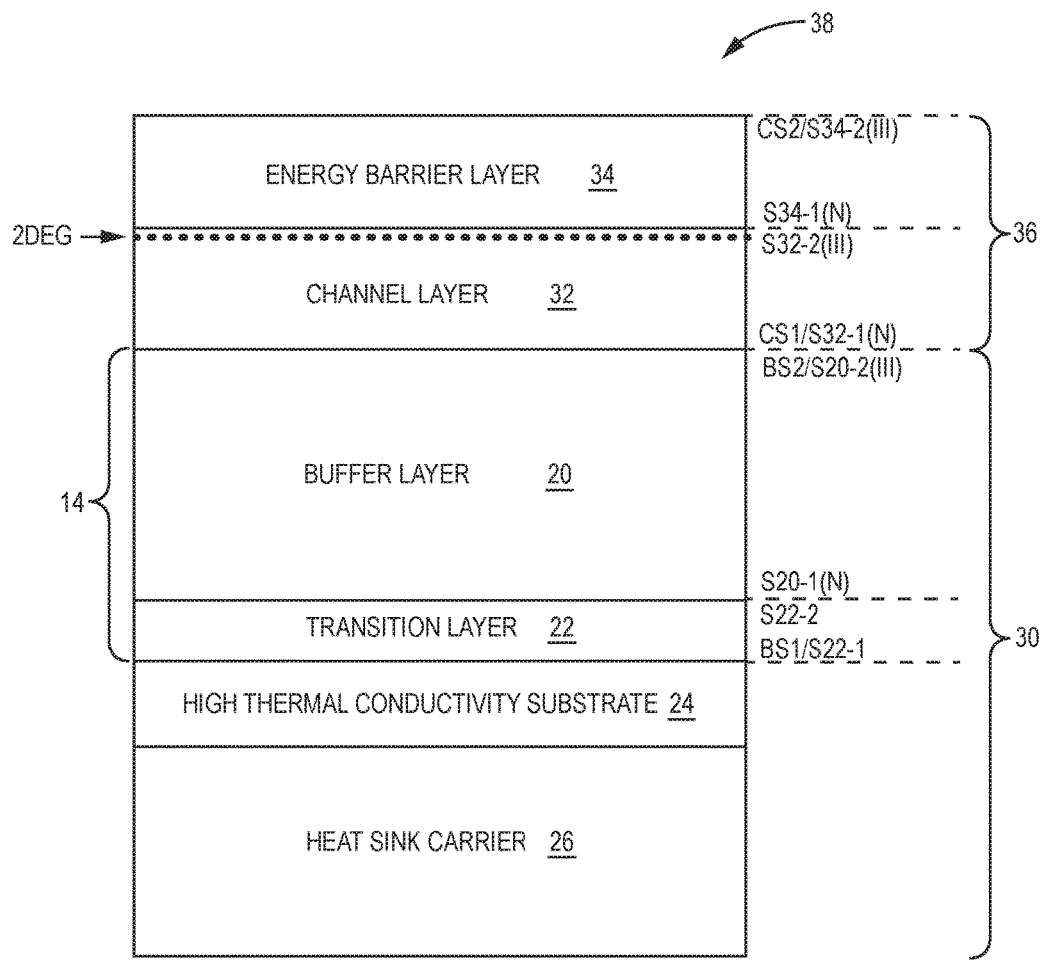

FIGS. 3A-3B illustrate an exemplary process to form a channel structure over the thermally enhanced precursor 30 formed in FIG. 1F. After the thermally enhanced precursor 30 is formed, a channel layer 32 is formed over the exposed surface of the thermally enhanced precursor 30 as depicted in FIG. 3A. The channel layer 32 has a first surface S32-1 adjacent to the exposed surface of the thermally enhanced precursor 30, and a second surface S32-2 opposite the first surface S32-1 of the channel layer 32. In this embodiment, the channel layer 32 may be formed of GaN or the like, such that the first surface S32-1 of the channel layer 32 has an N-polarity and the second surface S32-2 of the channel layer 32 has a group III-polarity.

Next, an energy barrier layer 34 is formed over the channel layer 32 to complete a channel structure 36 and provide a semiconductor device 38, as depicted in FIG. 3B. The energy barrier layer 34 has a first surface S34-1 adjacent to the second surface S32-2 of the channel layer 32, and a second surface S34-2 opposite the first surface S34-1 of the energy barrier layer 34. In this embodiment, the energy barrier layer 34 may be formed of Aluminum Gallium Nitride (AlGaN) or the like, such that the first surface S34-1 of the energy barrier layer 34 has an N-polarity and the second barrier surface S34-2 of the energy barrier layer 34 has a group III-polarity. The main purpose of the energy barrier layer 34 is to confine electrons and form a two-dimensional electron gas (2DEG) near an interface between the energy barrier layer 34 and the channel layer 32. Normally, the 2DEG is formed adjacent to both an N-polarity surface of the energy barrier layer 34 and a group III-polarity surface of the channel layer 32. Consequently, in this embodiment, the first surface S34-1 of the energy barrier layer 34 with the N-polarity needs to be adjacent to the second surface S32-2 of the channel layer 34 with the group III-polarity.

The semiconductor device 38 has the heat sink carrier 26 at a bottom portion of the semiconductor device 38, the high the thermal conductivity substrate 24 over the heat sink carrier 26, the buffer structure 14 over the thermal conductivity substrate 24, and a channel structure 36 over the buffer structure 14. The high thermal conductivity substrate 24 has a thermal conductivity greater than 400 W/mK. The channel structure 36 has a first channel surface CS1 and a second channel surface CS2. In this embodiment, the first surface S32-1 of the channel layer 32 may be the first channel surface CS1, and the second surface S34-2 of the energy barrier layer 34 may be the second channel surface CS2, which is opposite the first channel surface CS1. The growth direction of the buffer structure 14 is from the second buffer surface BS2 with a group III-polarity toward the heat sink carrier 26. A growth direction of the channel structure 36 is from the first channel surface CS1 with an N-polarity to the second channel surface CS2 with a group III-polarity.

Figure 4A:
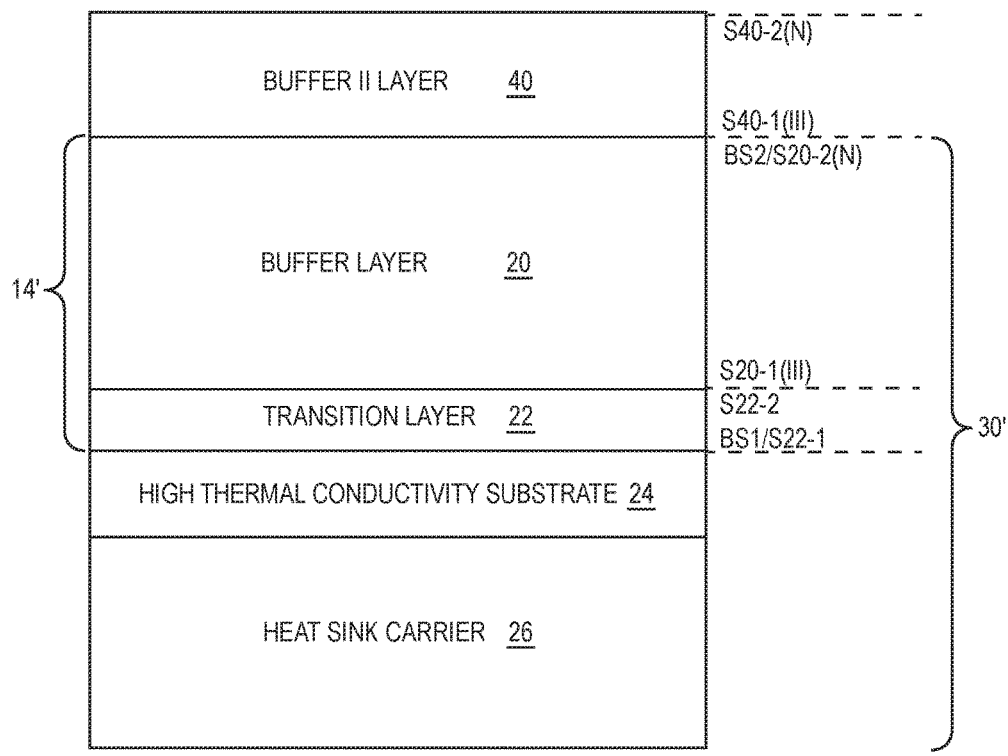
FIGS. 4A-4C illustrate an exemplary process to form a channel structure over the thermally enhanced precursor formed in FIG. 2 in order to provide a semiconductor device with enhanced thermal performance.
Figure 4B:
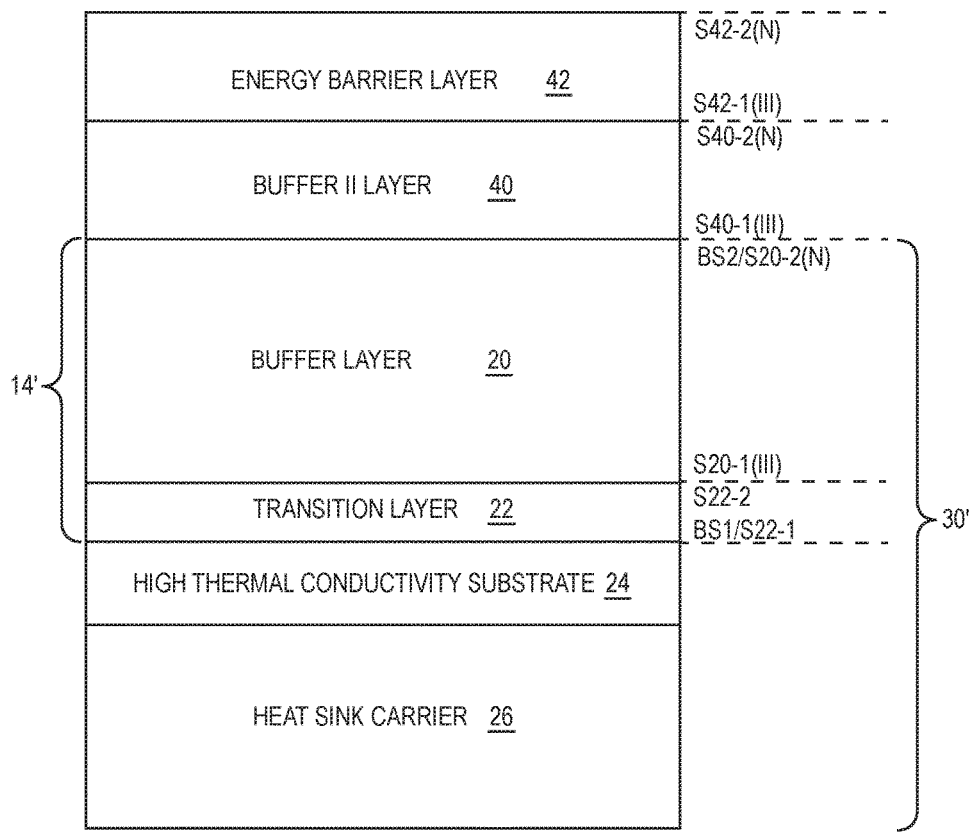
Figure 4C:
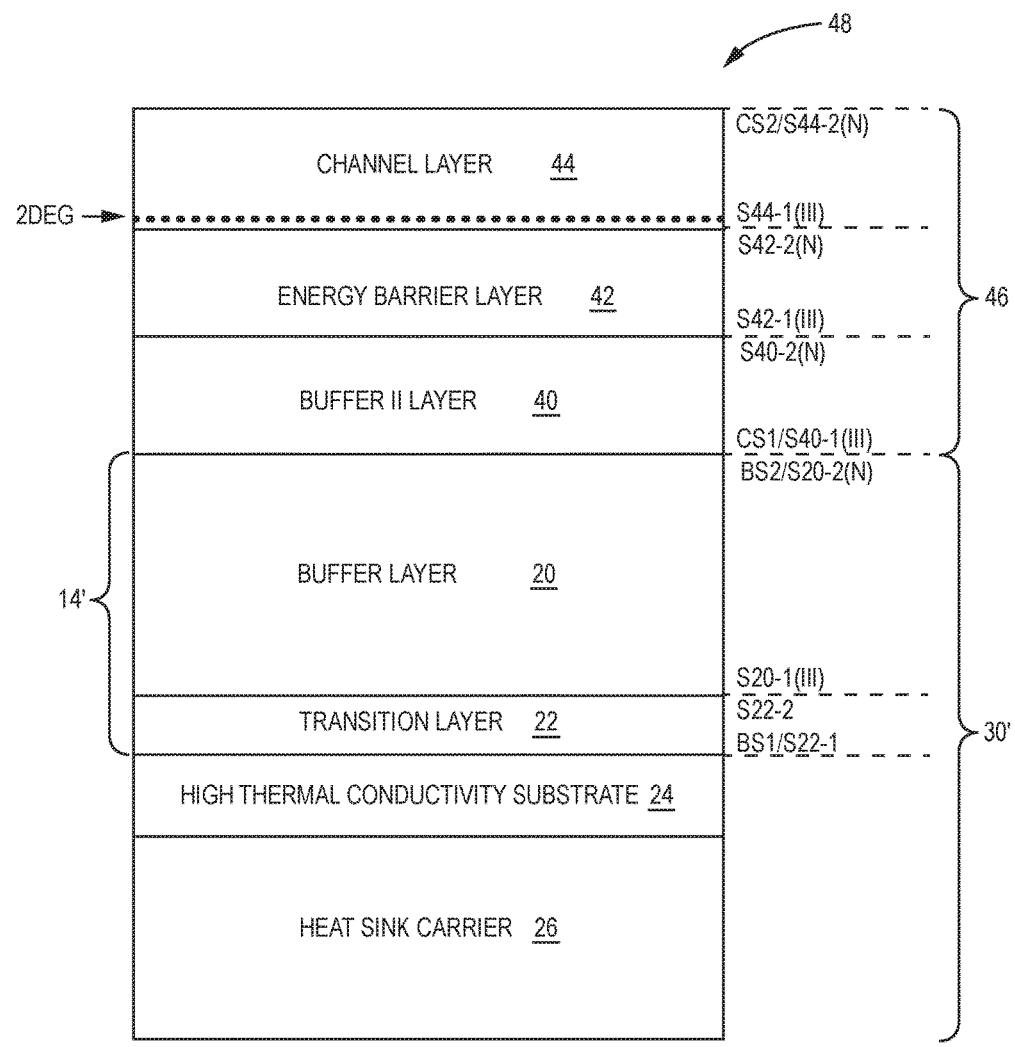

FIGS. 4A-4C illustrate an exemplary process to form a channel structure over the thermally enhanced precursor 30' formed in FIG. 2. After the thermally enhanced precursor 30 is formed, a buffer II layer 40 is formed over the exposed surface of the thermally enhanced precursor 30' as depicted in FIG. 4A. The buffer II layer 40 has a first surface S40-1 adjacent to the exposed surface of the thermally enhanced precursor 30', and a second surface S40-2 opposite the first surface S40-1 of the buffer II layer 40. In this embodiment, the buffer II layer 40 may be formed of GaN or the like, such that the first surface S40-1 of the buffer II layer 40 has a group III-polarity and the second surface S40-2 of the buffer II layer 40 has an N-polarity. Herein, the buffer II layer 40 is used to enable high quality channel layer and energy barrier layer formation in following processes.

An energy barrier layer 42 is then formed over the buffer II layer 40 as depicted in FIG. 4B. The energy barrier layer 42 has a first surface S42-1 adjacent to the second surface S40-2 of the buffer II layer 40, and a second surface S42-2 opposite the first surface S42-1 of the energy barrier layer 42. In this embodiment, the energy barrier layer 42 may be formed of AlGaN or the like, such that the first surface S42-1 of the energy barrier layer 42 has a group III-polarity and the second surface S42-2 of the energy barrier layer 42 has an N-polarity.

Finally, a channel layer 44 is formed over the energy barrier layer 42 to complete a channel structure 46 and provide a semiconductor device 48 as depicted in FIG. 4C. The channel layer 44 has a first surface S44-1 adjacent to the second surface S42-2 of the energy barrier layer 42, and a second surface S44-2 opposite the first surface S44-1 of the channel layer 44. In this embodiment, the channel layer 44 may be formed of GaN or the like, such that the first surface S44-1 of the channel layer 44 has a group-III-polarity and the second surface S44-2 of the channel layer 44 has an N-polarity. A 2DEG is formed near an interface between the energy barrier layer 42 and the channel layer 44. Since the 2DEG is normally formed adjacent to both an N-polarity surface of the energy barrier layer 42 and a group III-polarity surface of the channel layer 44, the second surface S42-2 of the energy barrier layer 42 with the N-polarity needs to be adjacent to the first surface S44-1 of the channel layer 44 with the group III-polarity.

The semiconductor device 48 has the heat sink carrier 26 at a bottom portion of the semiconductor device 48, the high thermal conductivity substrate 24 over the heat sink carrier 26, the buffer structure 14' over the thermal conductivity substrate 24, and the channel structure 46 over the buffer structure 14'. The high thermal conductivity substrate 24 has a thermal conductivity greater than 400 W/mK. The channel structure 46 has a first channel surface CS1 and a second channel surface CS2. In this embodiment, the first surface S40-1 of the buffer II layer 40 may be the first channel surface CS1, and the second surface S44-2 of the channel layer 44 may be the second channel surface CS2, which is opposite the first channel surface CS1. The growth direction of the buffer structure 14' is from the second buffer surface BS2 with the N-polarity toward the heat sink carrier 26. A growth direction of the channel structure 46 is from the first channel surface CS1 with the group III-polarity to the second channel surface CS2 with the N-polarity.

FIGS. 5A-5G illustrate an alternative process to form a semiconductor device with a high thermal conductivity substrate according to one embodiment of the present disclosure. Although the exemplary process is illustrated as a series of sequential steps, the exemplary process is not necessarily order dependent. Some operations may be done in a different order than that presented. Further, processes within the scope of this disclosure may include fewer or more steps than those illustrated in FIGS. 5A-5G.

Figure 5A:
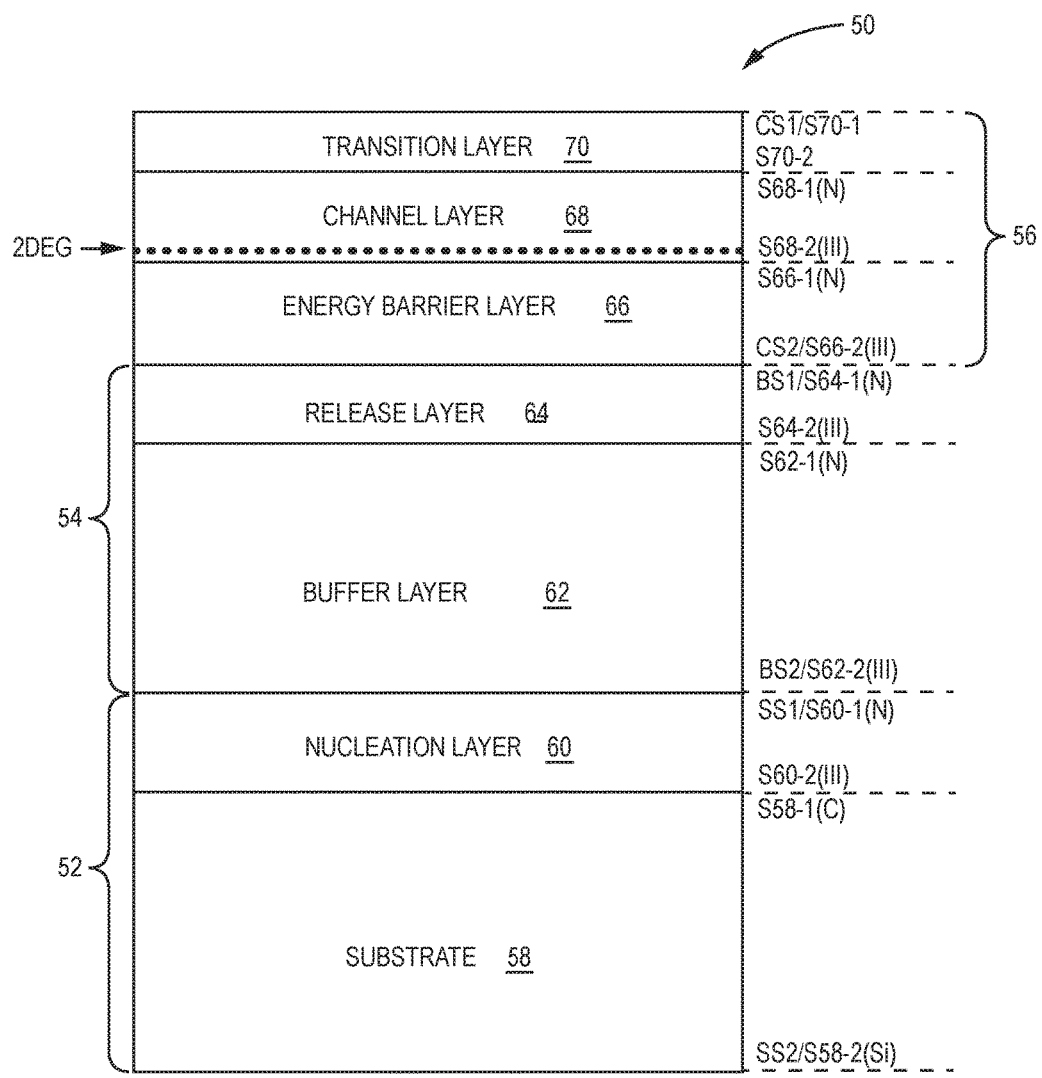
FIGS. 5A-5G illustrate an exemplary process to form a semiconductor device with a high thermal conductivity substrate according to one embodiment of the present disclosure.

Initially, a semiconductor precursor 50 including a substrate structure 52, a buffer structure 54 over the substrate structure 52, and a channel structure 56 over the buffer structure 54 is provided as depicted in FIG. 5A. The substrate structure 52 includes a substrate 58 and a nucleation layer 60 over the substrate 58, and has a first substrate surface SS1 and a second substrate surface SS2. In this embodiment, the substrate 58 may be formed of SiC, having a first surface S58-1 with a C-polarity and a second surface S58-2 with a Si-polarity. The nucleation layer 60, which is used to prevent the substrate 58 incorporating with the buffer structure 54, may be formed of AlN or the like, having a first surface S60-1 with an N-polarity and a second surface S60-2 with a group III-polarity. The first surface S58-1 of the substrate 58 is adjacent to the second surface S60-2 of the nucleation layer 60. The second surface S58-2 of the substrate 58 is opposite the first surface S58-1 of the substrate 58, and the first surface S60-1 of the nucleation layer 60 is opposite the second surface S60-2 of the nucleation layer 60. Further, the first surface S60-1 of the nucleation layer 60 may be the first substrate surface SS1 and the second surface S58-2 of the substrate 58 may be the second substrate surface SS2, which is opposite the first substrate surface.

The buffer structure 54 includes a buffer layer 62 and a release layer 64 over the buffer layer 62, and has a first buffer surface BS1 and a second buffer surface BS2. The buffer layer 62 may be formed of GaN or the like, having a first surface S62-1 with an N-polarity and a second surface S62-2 with a group III-polarity. The release layer 64 may be formed of Indium gallium nitride (InGaN) or the like, having a first surface S64-1 with an N-polarity and a second surface S64-2 with a group III-polarity. The first surface S62-1 of the buffer layer 62 is adjacent to the second surface S64-2 of the release layer 64. The second surface S62-2 of the buffer layer 62 is opposite the first surface S62-1 of the buffer layer 62, and the first surface S64-1 of the release layer 64 is opposite the second surface S64-2 of the release layer 64.

Further, the first surface S64-1 of the release layer 64 may be the first buffer surface BS1 and the second surface S62-2 of the buffer layer 62 may be the second buffer surface BS2. Herein the second buffer surface BS2 is opposite the first buffer surface BS1 and adjacent to the first substrate surface SS1.

In addition, the channel structure 56 includes an energy barrier layer 66 and a channel layer 68 over the energy barrier layer 66. The energy barrier layer 66 may be formed of AlGaN or the like, having a first surface S66-1 with an N-polarity and a second surface S66-2 with a group III-polarity. The channel layer 68 may be formed of GaN or the like, having a first surface S68-1 with an N-polarity and a second surface S68-2 with a group III-polarity. A 2DEG is formed at an interface between the energy barrier layer 66 and the channel layer 68. Since the 2DEG is normally formed adjacent to both an N-polarity surface of the energy barrier layer 66 and a group III-polarity surface of the channel layer 68, the first surface S66-1 of the energy barrier layer 66 with the N-polarity needs to be adjacent to the second surface S68-2 of the channel layer 68 with the group III-polarity.

The channel structure 56 having a first channel surface CS1 and a second channel surface CS2 may further include a transition layer 70 over the channel layer 68. Herein, the transition layer 70 is an in situ transition layer, which is used to achieve a reliable bonding between the channel structure 56 and a high thermal conductivity substrate in a following process. The transition layer 70 may be formed from amorphous or polycrystalline materials, such as AlN, Silicon Nitride ($SiN_x$), or the like, with a thickness between 0 nm and 100 nm. In different applications, the transition layer 70 may be not polarized or have mixed polarization. The transition layer 70 has a first surface S70-1 and a second surface S70-2, which is opposite the first surface S70-1 of the transition layer 70 and adjacent to the first surface S68-1 of the channel layer 68. Further, the first surface S70-1 of the transition layer 70 may be the first channel surface CS1 and the second surface S66-2 of the energy barrier layer 66 may be the second channel surface CS2. Herein, the second channel surface CS2 is opposite the first channel surface CS1 and adjacent to the first buffer surface BS1. In some applications, the channel structure 56 may not include the transition layer 70. As such, the first surface S68-1 of the channel layer 68 may be the first channel surface CS1 and the second surface S66-2 of the energy barrier layer 66 may be the second channel surface CS2.

Figure 5B:
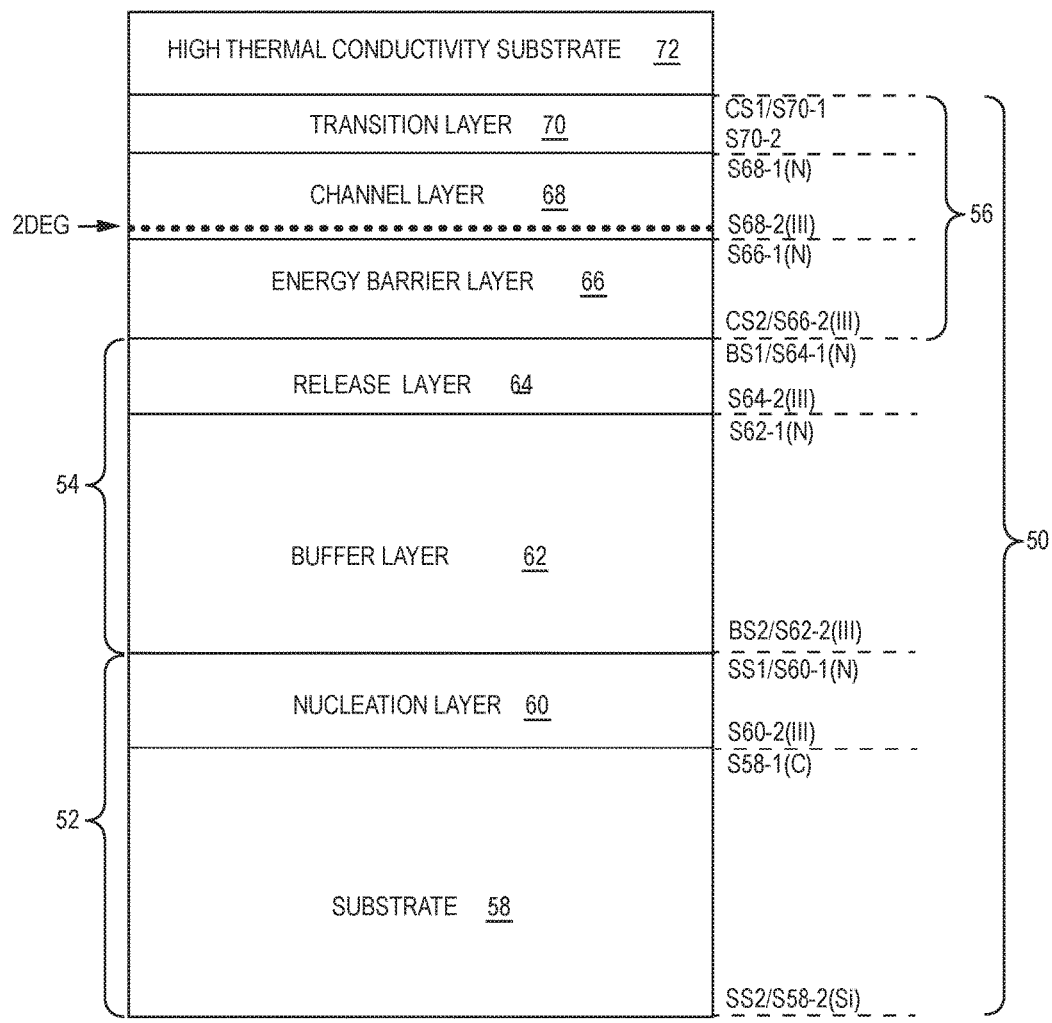
Figure 5C:
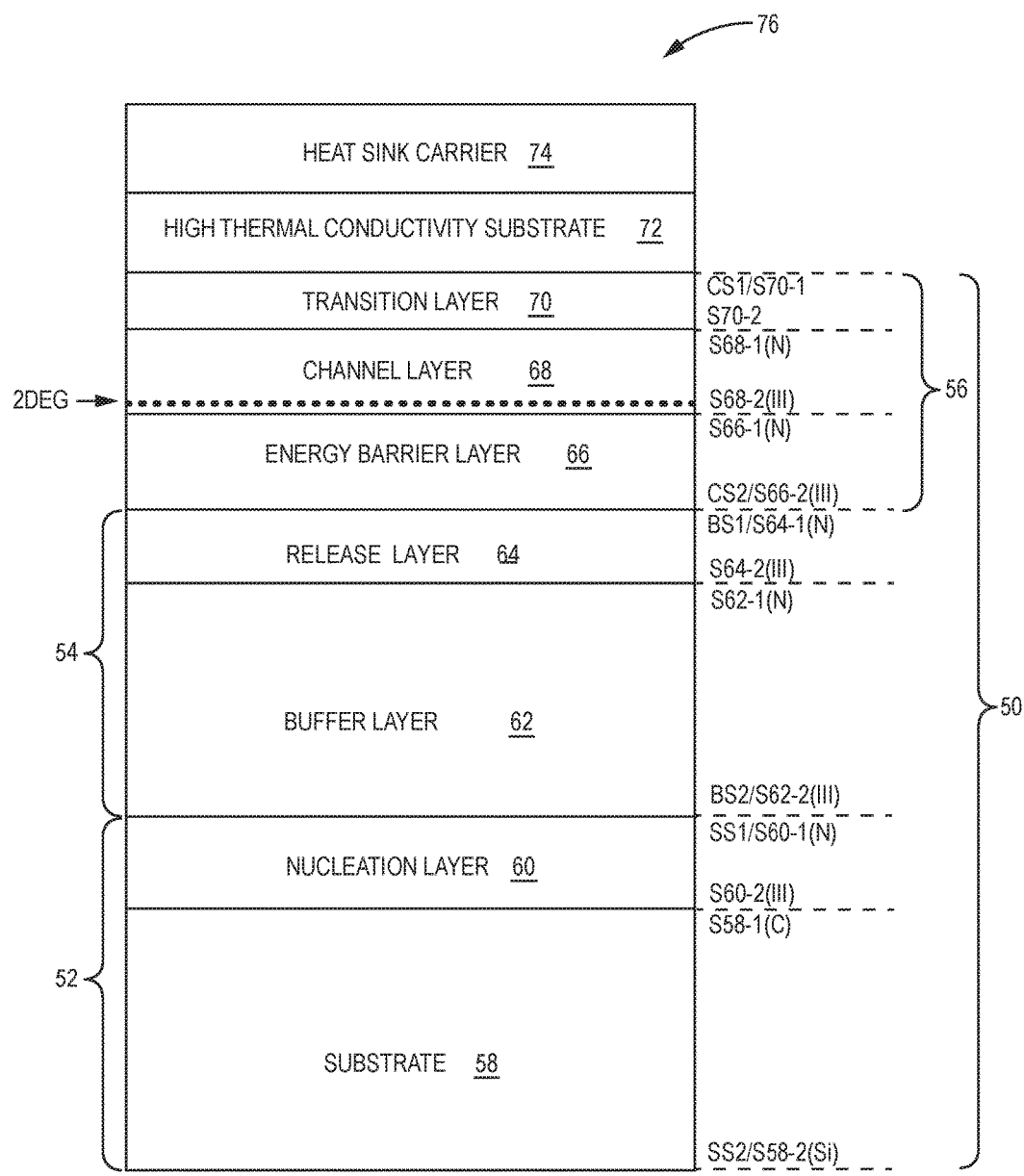

Next, a high thermal conductivity substrate 72 is formed over the channel structure 56 and adjacent to the first channel surface CS1 as depicted in FIG. 5B. The high thermal conductivity substrate 72 has a thermal conductivity greater than 400 W/mK, and a thickness between 0.5 μm and 500 μm. One exemplary material used to form the high thermal conductivity substrate 72 is diamond. Others may include Boron Nitride, Boron Arsenide, or the like. Forming the high thermal conductivity substrate 72 may be provided by a chemical vapor deposition process. A heat sink carrier 74 is then provided over the high thermal conductivity substrate 72 to form an intermediate structure 76 as depicted in FIG. 5C. The heat sink carrier 74 may be formed from polycrystalline diamond, Boron Nitride, Boron Arsenide, or the like. The heat sink carrier 74 has a thermal conductivity greater than 400 W/mK, and a thickness between 0.5 μm and 500 μm. The heat sink carrier 74 may be provided by a wafer bonding process or a thick film growth process.

Figure 5D:
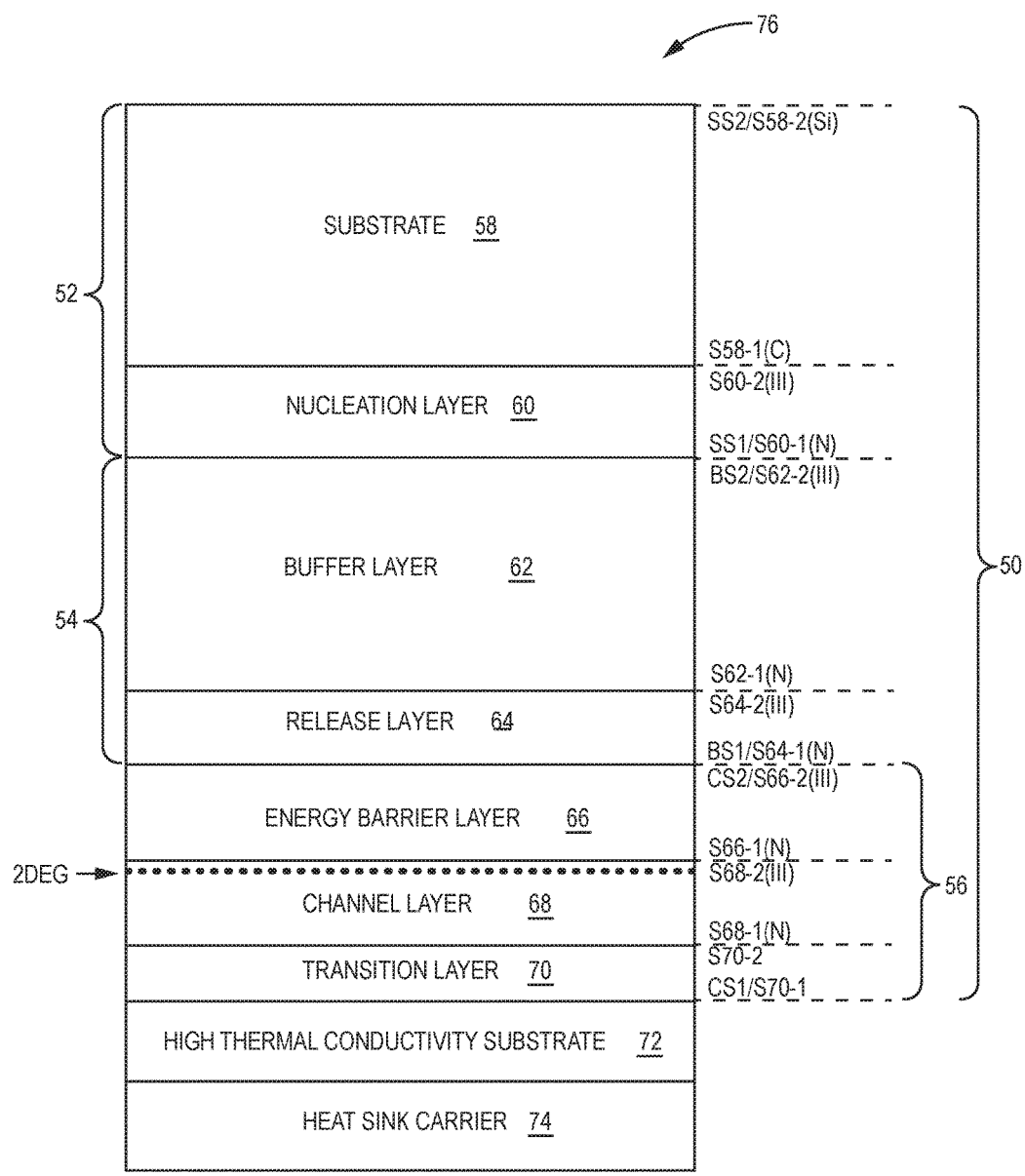

After the intermediate structure 76 is formed, the intermediate structure 76 is flipped as depicted in FIG. 5D. As such, the heat sink carrier 74 is at a bottom portion of the intermediate structure 76, the high thermal conductivity substrate 72 is over the heat sink carrier 74, the channel structure 56 is over the high thermal conductivity substrate 72, the buffer structure 54 is over the channel structure 56, and the substrate structure 52 is over the buffer structure 54 and at a top portion of the intermediate structure 76.

Figure 5E:
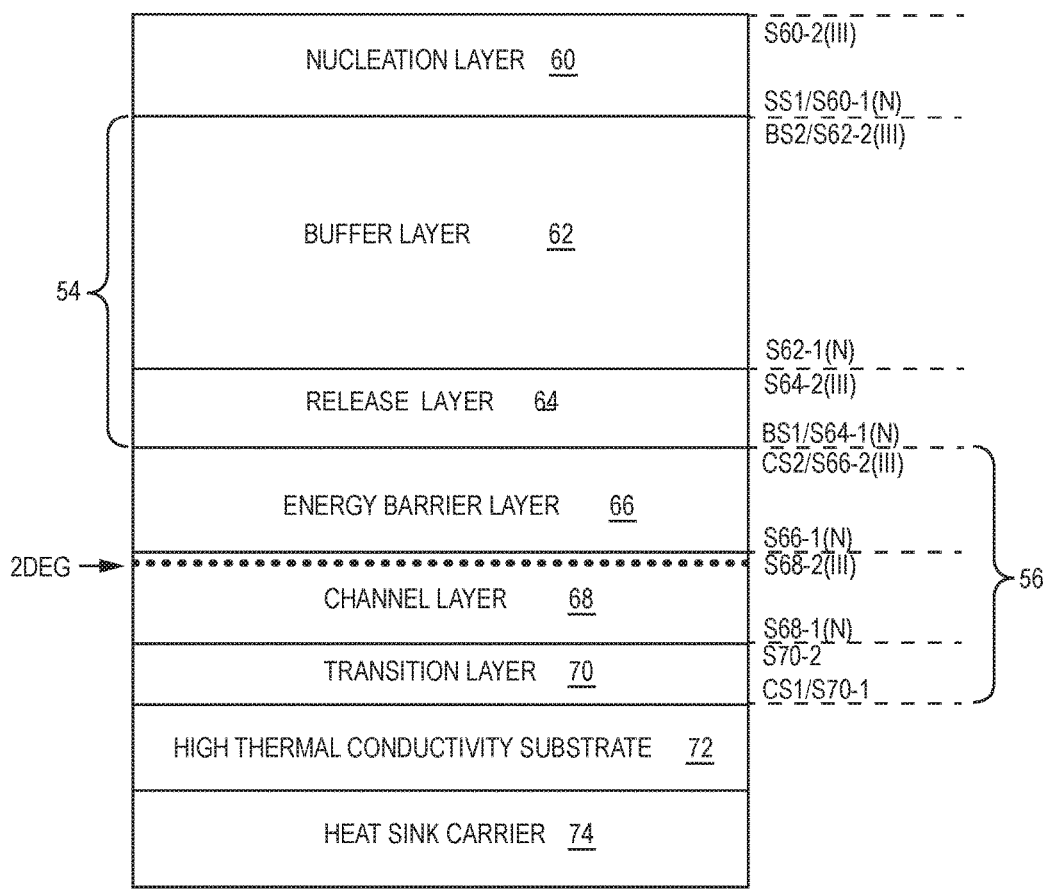
Figure 5F:
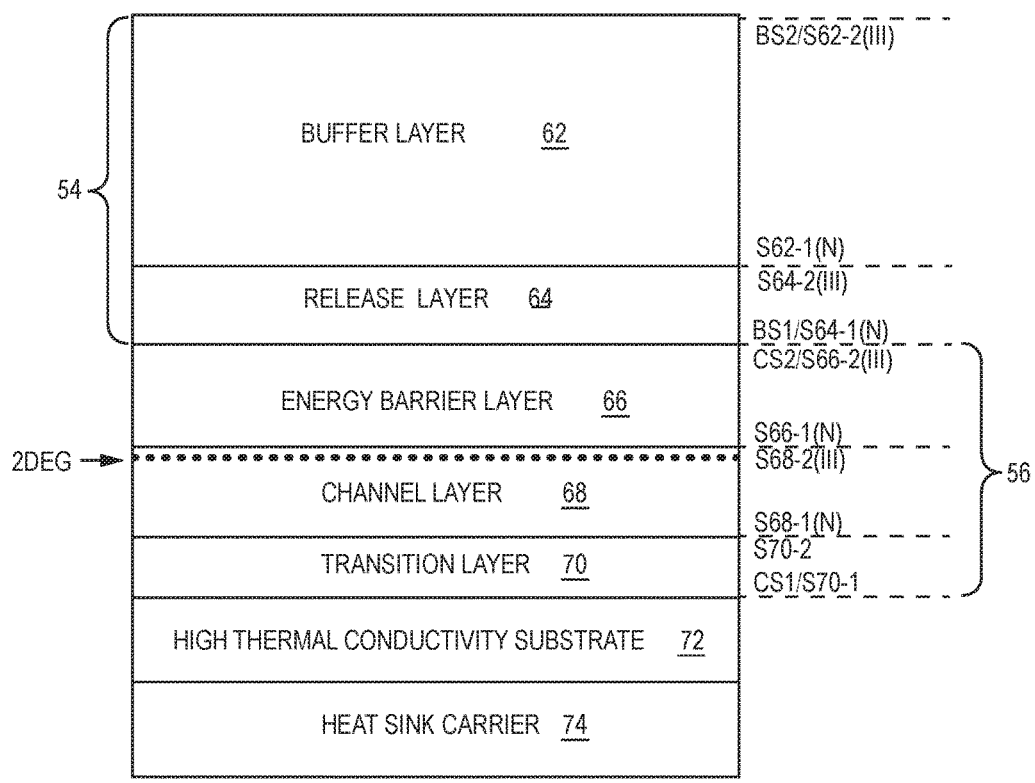

FIG. 5E and FIG. 5F illustrate removing the substrate structure 52. The substrate 58 is first removed as depicted in FIG. 5E. The removal of the substrate 58 may be provided by mechanical polishing or dry/wet etching. The nucleation layer 60 is then removed to expose the second buffer surface BS2 with the group III-polarity as depicted in FIG. 5F. The removal of the nucleation layer 60 may be provided by mechanical polishing or dry/wet etching.

Figure 5G:
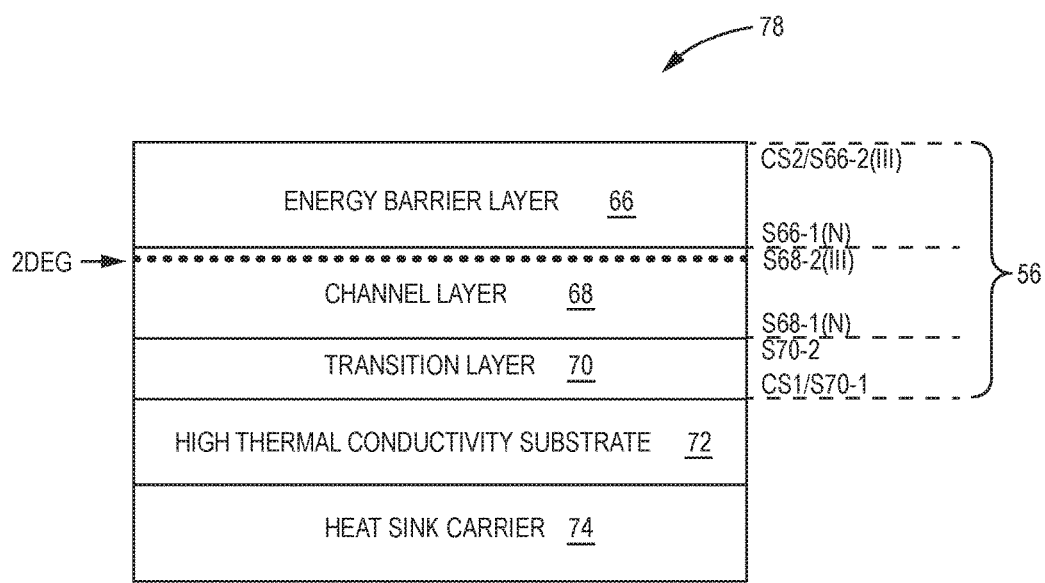

FIG. 5G illustrates removing substantially all of the buffer structure 54 to form a thermally enhanced semiconductor device 78 with an exposed surface. Herein, removing substantially all of the buffer structure 54 is defined as removing all of the buffer layer 62, and if the release layer 64 is present, removing at least 90% of the release layer 64. The removal may also include removing a portion of the energy barrier layer 66. As such, in some cases, there is a thin layer of the release layer 64 left over the channel structure 56, and in other cases, the release layer 64 is removed completely and the energy barrier layer 66 is exposed. The exposed surface of the thermally enhanced semiconductor device 78 has the same polarity (a group III-polarity) as the second channel surface CS2. Mechanical polishing or dry/wet etching may be used to remove the buffer layer 62 and the release layer 64. The thermally enhanced semiconductor device 78 has the heat sink carrier 74 at a bottom portion of the thermally enhanced semiconductor device 78, the high thermal conductivity substrate 72 over the heat sink carrier 74, and the channel structure 56 over the high thermal conductivity substrate 72. The high thermal conductivity substrate 72 has a thermal conductivity greater than 400 W/Mk. The growth direction of the channel structure 56 is from the second channel surface CS2 with the group III-polarity toward the heat sink carrier 74.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
   providing a semiconductor precursor comprising a substrate structure, and a buffer structure over the substrate structure, and having a first buffer surface and a second buffer surface, which has a first polarity, wherein the first buffer surface is opposite the second buffer surface and the second buffer surface is adjacent to the substrate structure;
   forming a high thermal conductivity substrate over the first buffer surface, wherein the high thermal conductivity substrate has a thermal conductivity greater than 400 W/mK;
   providing a heat sink carrier over the high thermal conductivity substrate to form an intermediate structure; and
   removing substantially all of the substrate structure to provide a thermally enhanced precursor with an exposed surface, which has the first polarity.

2. The method of claim 1 further comprising flipping the intermediate structure before removing the substrate structure, such that the substrate structure is over the buffer structure and at a top portion of the intermediate structure.

3. The method of claim 1 wherein the buffer structure comprises:
a buffer layer having a first surface and a second surface opposite the first surface of the buffer layer and adjacent to the substrate structure; and
a transition layer having a first surface and a second surface opposite the first surface of the transition layer, wherein the second surface of the transition layer is adjacent to the first surface of the buffer layer, the first surface of the transition layer is the first buffer surface, and the second surface of the buffer layer is the second buffer surface.

4. The method of claim 3 wherein the buffer layer is formed of Gallium Nitride (GaN), and the transition layer is formed of Aluminum Nitride (AlN) or Silicon Nitride ($SiN_x$).

5. The method of claim 1 wherein the buffer structure comprises a buffer layer having a first surface and a second surface opposite the first surface of the buffer layer, wherein the first surface of the buffer layer is the first buffer surface and the second surface of the buffer layer is the second buffer surface and adjacent to the substrate structure.

6. The method of claim 5 wherein the buffer layer is formed of Gallium Nitride (GaN).

7. The method of claim 1 wherein the first polarity is a group III polarity.

8. The method of claim 7 further comprising forming a channel structure over the exposed surface of the thermally enhanced precursor.

9. The method of claim 8 wherein forming the channel structure comprises:
forming a channel layer over the exposed surface, wherein the channel layer has a first surface adjacent to the exposed surface and a second surface opposite the first surface of the channel layer; and
forming an energy barrier layer over the channel layer, wherein the energy barrier layer has a first surface adjacent to the second surface of the channel layer and a second surface opposite the first surface of the energy barrier layer.

10. The method of claim 9 wherein:
the channel layer is formed of GaN, such that the first surface of the channel layer has a Nitrogen(N)-polarity and the second surface of the channel layer has a group III-polarity; and
the energy barrier layer is formed of Aluminum Gallium Nitride (AlGaN), such that the first surface of the energy barrier layer has an N-polarity and the second surface of the energy barrier layer has a group III-polarity.

11. The method of claim 1 wherein the first polarity is an N-polarity.

12. The method of claim 11 further comprising forming a channel structure over the exposed surface of the thermally enhanced precursor.

13. The method of claim 12 wherein forming the channel structure comprises:
forming a second buffer layer over the exposed surface, wherein the second buffer layer has a first surface adjacent to the exposed surface and a second surface opposite the first surface of the second buffer layer;
forming an energy barrier layer over the second buffer layer, wherein the energy barrier layer has a first surface adjacent to the second surface of the second buffer layer and a second surface opposite the first surface of the energy barrier layer; and
forming a channel layer over the energy barrier layer, wherein the channel layer has a first surface adjacent to the second surface of the energy barrier layer and a second surface opposite the first surface of the channel layer.

14. The method of claim 13 wherein:
the second buffer layer is formed of GaN, such that the first surface of the second buffer layer has a group III-polarity and the second surface of the channel layer has a N-polarity;
the energy barrier layer is formed of AlGaN, such that the first surface of the energy barrier layer has a group III-polarity and the second surface of the energy barrier layer has a N-polarity; and
the channel layer is formed of GaN, such that the first surface of the channel layer has a group III-polarity and the second surface of the channel layer has a N-polarity.

15. The method of claim 1 wherein the high thermal conductivity substrate is formed from diamond.

16. The method of claim 15 wherein forming the high thermal conductivity substrate is provided by a deposition process.

17. The method of claim 1 wherein the heat sink carrier is formed from polycrystalline diamond.

18. The method of claim 17 wherein forming the heat sink carrier is provided by a wafer bonding process or a thick film growth process.

* * * * *